(12) United States Patent
Pinjala et al.

(10) Patent No.: US 6,717,812 B1
(45) Date of Patent: Apr. 6, 2004

(54) APPARATUS AND METHOD FOR FLUID-BASED COOLING OF HEAT-GENERATING DEVICES

(75) Inventors: Damaruganath Pinjala, Singapore (SG); Vaidyanathan Kripesh, Singapore (SG); Hengyun Zhang, Singapore (SG); Mahadevan K Iyer, Singapore (SG); Ranganathan Nagarajan, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 10/367,740

(22) Filed: Feb. 19, 2003

(30) Foreign Application Priority Data

Nov. 21, 2002 (SG) .......................................... 200207020

(51) Int. Cl.[7] .................................................. H05K 7/20
(52) U.S. Cl. ....................... 361/699; 361/689; 361/721; 361/790; 257/714; 174/15.1; 165/80.4
(58) Field of Search ................................ 361/689, 690, 361/694, 695, 698, 699, 719–721, 790; 257/714; 174/15.1; 165/80.4

(56) References Cited

U.S. PATENT DOCUMENTS

| | | | |
|---|---|---|---|
| 4,841,355 A | * 6/1989 | Parks .......................... 257/686 |
| 4,879,629 A | 11/1989 | Tustaniwskyj et al. |
| 4,956,746 A | * 9/1990 | Gates et al. ................. 361/699 |
| 4,984,066 A | * 1/1991 | Iversen ........................ 257/714 |
| 5,380,956 A | 1/1995 | Loo et al. |
| 5,426,563 A | * 6/1995 | Moresco et al. ............. 361/689 |
| 5,737,186 A | * 4/1998 | Fuesser et al. ............... 361/699 |
| 5,901,037 A | 5/1999 | Hamilton et al. |
| 5,978,220 A | 11/1999 | Frey et al. |
| 6,377,461 B1 | * 4/2002 | Ozmat et al. ................ 361/704 |
| 6,611,057 B2 | * 8/2003 | Mikubo et al. .............. 257/714 |

* cited by examiner

*Primary Examiner*—Boris Chervinsky
(74) *Attorney, Agent, or Firm*—Nath & Associates PLLC; Harold L. Novick; Derek Richmond

(57) ABSTRACT

Method and apparatus for fluid-based cooling of heat-generating devices are disclosed. A heat-generating device is mounted on a carrier. The heat-generating device is spatially displaced from the surface of the carrier, thereby forming a channel. The heat-generating device and the carrier are enclosed in an enclosure having an inlet and an outlet. A substantially electrically non-conductive cooling fluid for introduction into the enclosure and into the channel and expulsion from the enclosure and for extracting heat from and thereby cooling the heat-generating device and the carrier.

19 Claims, 7 Drawing Sheets

APPARATUS AND METHOD FOR FLUID-BASED COOLING OF HEAT-GENERATING DEVICES

FIELD OF INVENTION

The present invention relates generally to the cooling of heat-generating devices, and more particularly, to an apparatus and a method for cling multiple chips using fluid.

BACKGROUND

The demand for compact, high speed, and multi-functional semiconductor devices or chips, as they are commonly known, is ever increasing. As these chips are shrinking in size and performing many tasks at high speeds, during operation extremely high amounts of heat are usually generated. To keep these chips operational and durable, the heat must be efficiently extracted to lower the temperature of the chips to a required level. A conventional cooling technique involves mounting a heat dissipating material, such as a heat sink, onto the surfaces of the chips to dissipate the heat. Another cooling technique requires mounting the chips on a printed circuit board (PCB), and running coolant over the exposed surfaces of the chips. Yet another cooling technique requires mounting the chips on a PCB over through-holes in the PCB. Coolant is then fed over the bottom surfaces of the chips via the though-holes. The disadvantage of these techniques is that only one surface or a partial surface of the chips is in contact with the coolant, therefore limiting the amount of heat removed from the chips.

Other more advanced conventional cooling techniques are described in U.S. Pat. Nos. 5,380,956, 4,879,629, 5,978,220, and 5,901,037.

In U.S. Pat. No. 5,380,956, a multi-chip cooling method is proposed. Chips are mounted on a plurality of substrates in such a manner that portions of the top and bottom surfaces of the chips are exposed. The substrates are arranged inside of a module so that when coolant flows through the module, the coolant is in contact with the exposed portions of the top and bottom surfaces of the chips, thereby extracting heat from the chips. A limitation of this technique lies in the sequential and serial flow of the coolant over the different chips mounted on the different substrates. This means that the chips mounted on the substrates arranged downstream of the flow path of the coolant are not effectively cooled. This is because by the time the coolant reaches these chips, the coolant having extracted and retained heat generated by the chips upstream is not therefore capable of effectively cooling these chips. A further limitation lies in the way the chips are mounted on the substrates. Significant portions of the surfaces of the chips are used for adhering the chips to the substrate. Thus, it is not possible to expose the entire surface of the chips to the coolant.

U.S. Pat. No. 4,879,629 describes a method for concurrently cooling a plurality of integrated circuit chips mounted on a substrate. This is achieved by passing coolant through channels formed between the elongated fins of a plurality of heat sinks. The plurality of heat sinks are attached to a plurality of heat-conducting studs that are attached to the plurality of integrated circuit chips for receiving heat generated by the integrated circuit chips.

In U.S. Pat. No. 5,978,220, chips are mounted on a substrate and the substrate is coupled to a cold plate. The cold plate is kept cool by flowing coolant thereonto, thereby indirectly cooling the chips.

In U.S. Pat. No. 5,901,037, elongated micro channels are formed in a substrate that carries one or more transistor dies. Coolant is fed through the micro channels for extracting the heat from the dies.

In the foregoing conventional cooling techniques, the coolant either does not cool the heat-generating devices directly but through intermediate materials or extracts heat only from a portion of the surface of the heat generating devices. Thus, the cooling of the devices is restricted to the amount of heat the intermediate materials can dissipate or the amount of heat the coolant is capable of extracting, respectively. Therefore, the amount of heat removed using the conventional methods is limited.

From the foregoing description, it is apparent that there is a need for a way to adequately dissipate heat from the surface of the heat-generating devices in the limited physical space that is available.

SUMMARY

In accordance with a first aspect of the invention, there is provided a method for fluid-based cooling of heat-generating devices, the method comprising the steps of:

mounting a heat-generating device onto a first portion of the surface of a first carrier;

spatially displacing the heat-generating device from the first portion of the surface of the first carrier for forming a first channel therebetween;

stacking a second carrier and the first carrier;

spatially displacing the second carrier from the first carrier for forming a second channel between a portion of the surface of the first heat-generating device and a portion of the surface of the second carrier;

enclosing at least a portion of the second carrier, the heat-generating device and at least a portion of the first carrier; and introducing cooling fluid into the enclosure and into at least one of the first and second channels, the cooling fluid being substantially electrically non-conductive and for extracting heat from and thereby cooling at least one of the heat-generating device and at least one of the portions of the surface of the first carrier and the portion of the surface of the second carriers, wherein heat generating devices are mountable only on each of the portion of the surface of the first carrier and a portion of the surface of the second carrier, the portion of the surface of the first carrier being substantially parallel to and facing the same direction as the portion of the surface of the second carrier.

In accordance with a second aspect of the invention, there is provided a cooling assembly for fluid-based cooling of heat-generating devices, the cooling assembly comprising:

a first carrier;

a heat-generating device mounted on a first portion of the surface of the first carrier;

a first channel formed by spatially displacing the heat-generating device from the first portion of the surface of the first carrier;

a second carrier, wherein the first and second carriers are stacked;

a second channel formed by spatially displacing the second carrier from the first carrier, the second channel being the space between a portion of the surface of the heat-generating device and a portion of the surface of the second carrier; and an enclosure, for enclosing at least a portion of the second carrier, the heat-generating device and at least a portion of the first carrier, whereby cooling fluid is introduced into the enclosure and into at least one of the first and second channels, the cooling fluid being substantially electrically non-conductive and being for extracting heat from and thereby cooling at least one of the heat-generating device and the at least the portions of the first and second carriers, wherein heat generating devices are mountable only on each of the portion of the surface of the first carrier and a portion of the surface of the second carrier, the portion of the surface of the first carrier being substantially parallel to and facing the same direction as the portion of the surface of the second carrier.

In accordance with a third aspect of the invention there is disclosed a method for fluid-based cooling of heat-generating devices, comprising the steps of:

mounting a heat-generating device onto a first portion of the surface of a first carrier;

spatially displacing the heat-generating device from the first portion of the surface of the first carrier for forming a first channel therebetween the heat generating device being substantially received within a concavity, the concavity being formed in the first carrier and defining the first portion of the surface of the first carrier at least a portion of the first channel extending within the concavity;

stacking a second carrier and the first carrier;

spatially displacing the second carrier from the first carrier for forming second channel between a portion of the surface of the first heat-generating device and a portion of the surface of the second carrier;

enclosing at least a portion of the second carrier, the heat-generating device and at least a portion of the first carrier; and introducing cooling fluid into the enclosure and into at least one of the first and second channels, the cooling fluid being substantially electrically non-conductive and for extracting heat from and thereby cooling at least one of the heat-generating device and at least one of the first portion of the surface of the first carrier and the portion of the surface of the second carrier, the concavity being shaped and dimensioned for the passage of the cooling fluid therethrough, wherein heat generating devices are mountable only on each of the portion of the surface of the first carrier and a portion of the surface of the second carrier, the portion of the surface of the first carrier being substantially parallel to and facing the same direction as the portion of the surface of the second carrier.

BRIEF DESCRIPTION OF THE DRAWINGS

Embodiments of the invention are described hereinafter with reference to the following drawings, in which.

DETAILED DESCRIPTION

Figure 1:
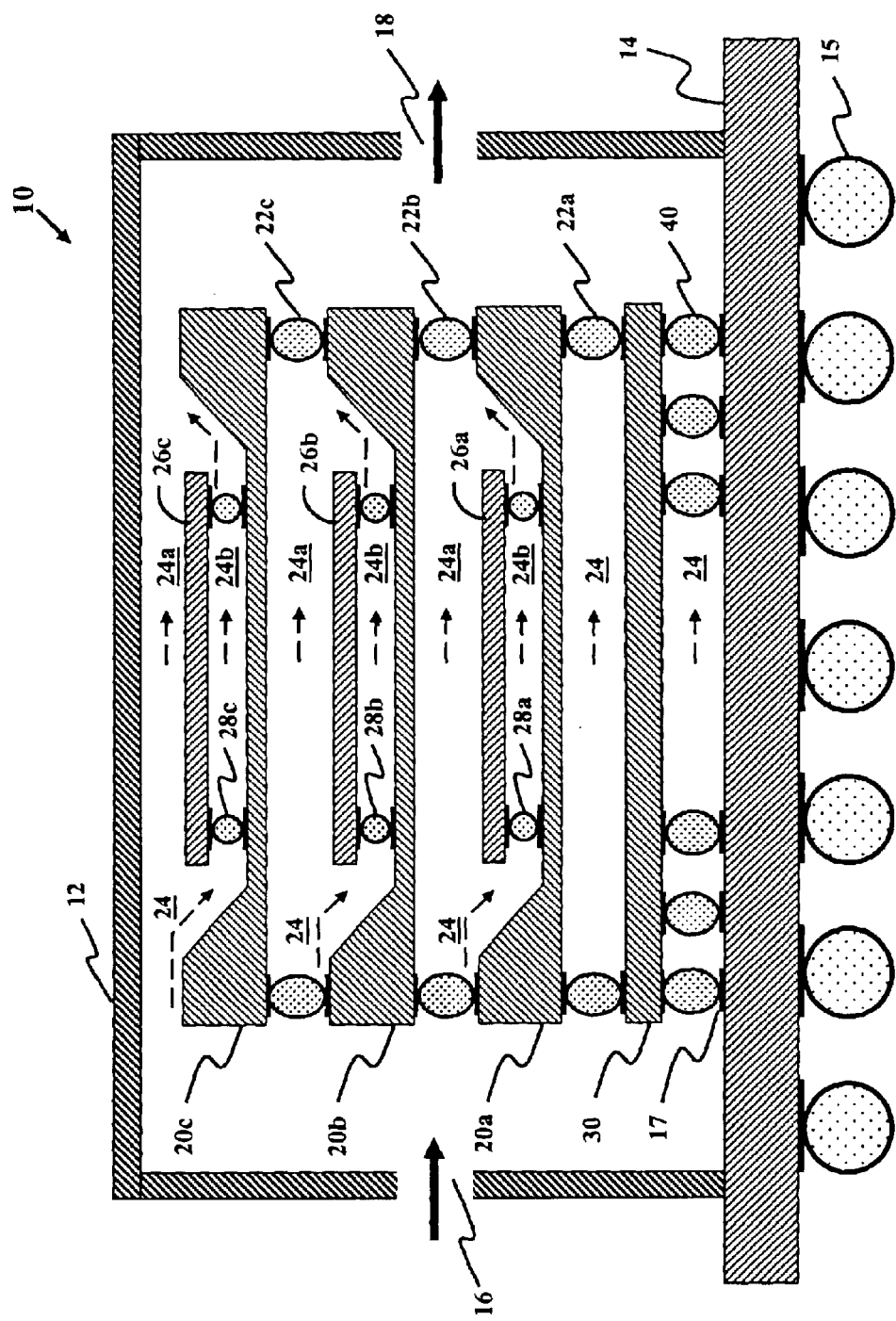
FIG. 1 shows a cross-sectional front view of a cooling assembly in accordance with a first embodiment of the invention.

An efficient fluid-based cooling apparatus and a method for cooling heat-generating devices according to embodiments of the invention are described hereinafter. The description is provided with reference to the figures of the drawings, wherein like elements are identified with like reference numerals.

Figure 2:
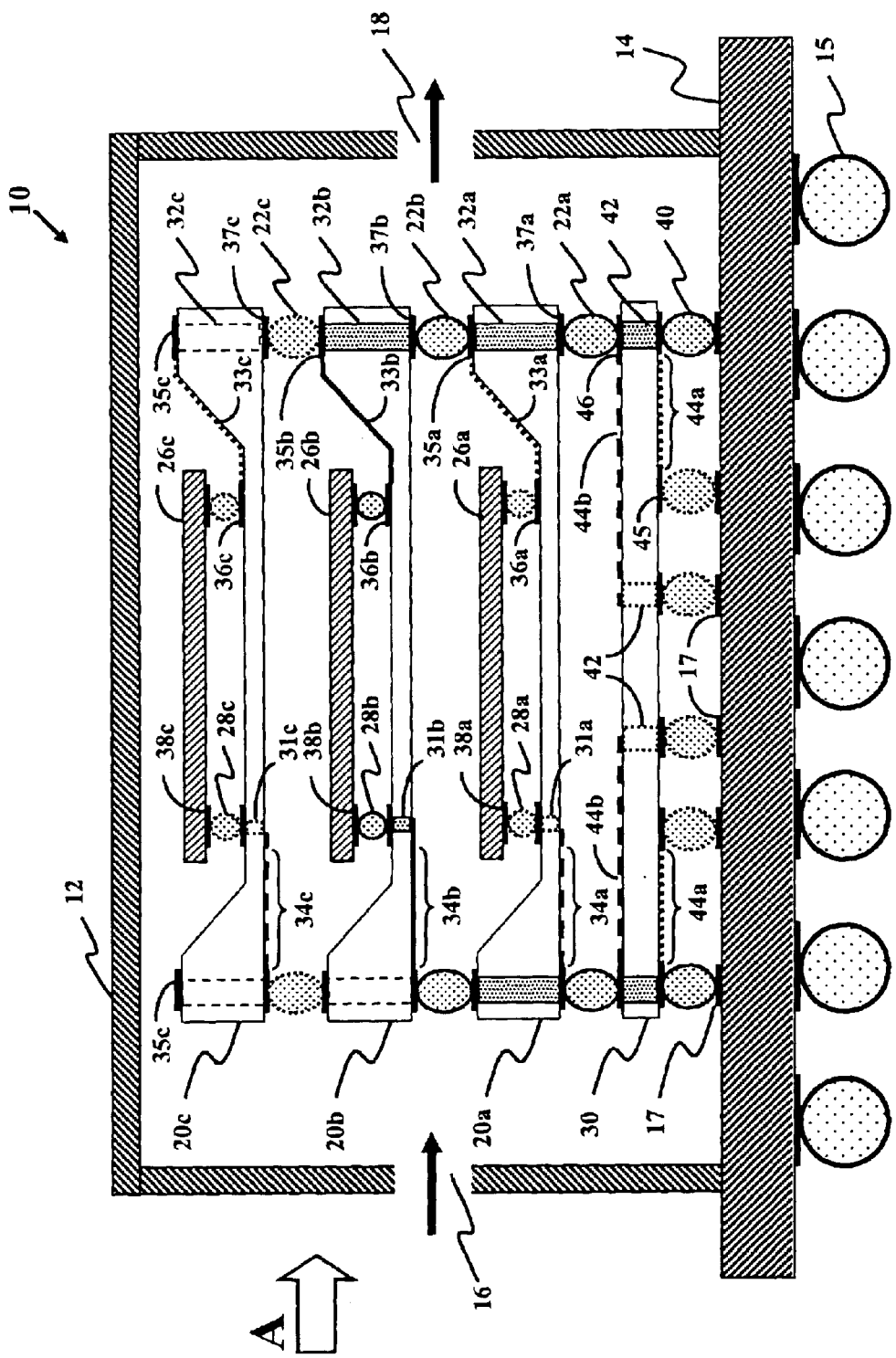
FIG. 2 shows a cross-sectional front view of the cooling assembly of FIG. 1 illustrating the electrical interconnections between the various elements of the cooling assembly.
Figure 3:
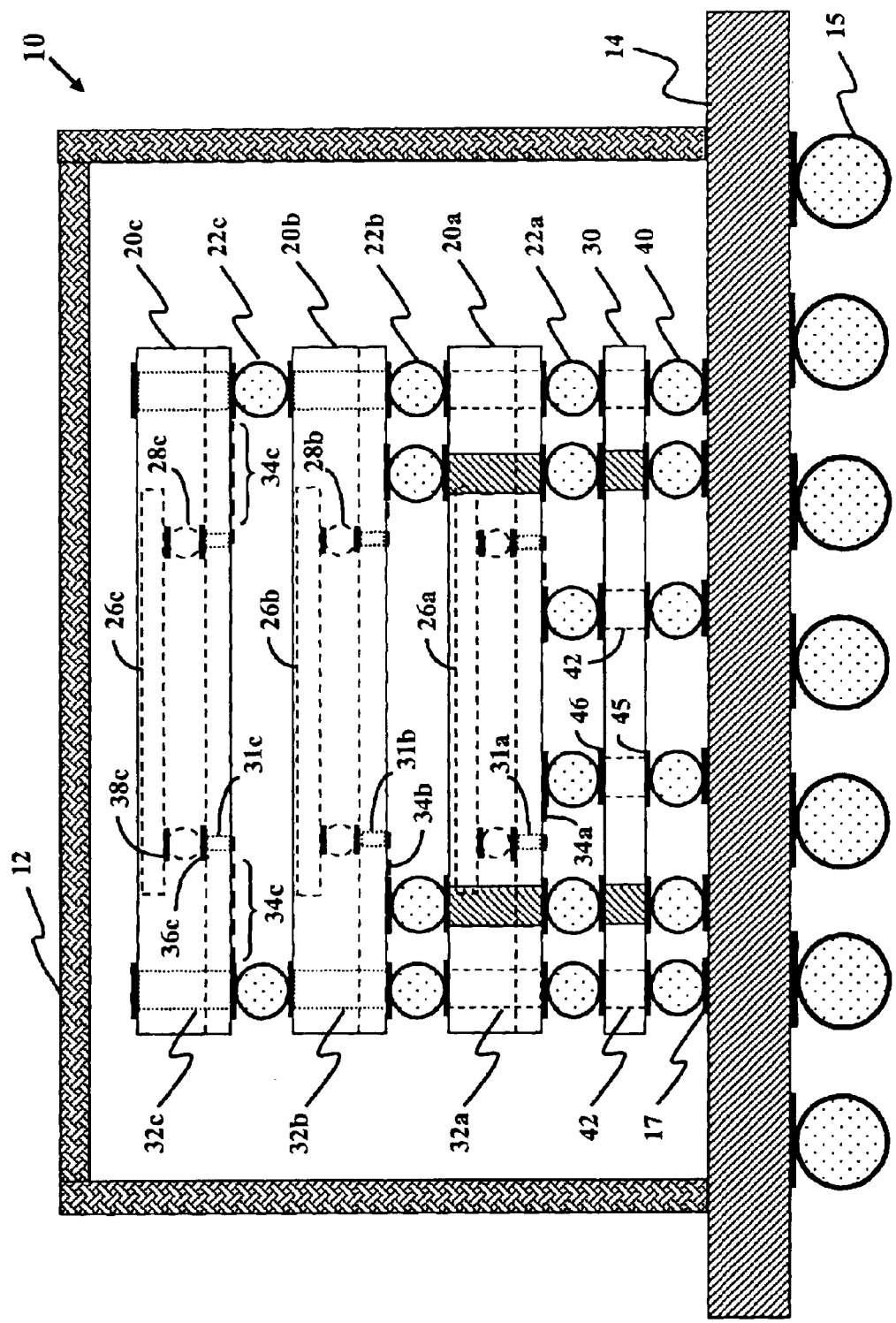
FIG. 3 shows a cross-sectional side view from side A of the cooling assembly of FIG. 2 illustrating the electrical interconnections between the various elements of the cooling assembly.

A fluid-based cooling assembly 10 according to a fist embodiment of the invention is shown in FIGS. 1, 2 and 3. The cooling assembly 10 includes an enclosure 12 bonded or otherwise attached to a substrate 14 to form an outer casing, a plurality of chip carriers 20(a–c) on which a plurality of heat-generating devices 26(a–c) is mounted, and a distribution carrier 30. A concavity (shown but not indicated be reference numeral) is formed in each of the plurality of chip carriers 20 for substantially receiving the corresponding one of the plurality of heat-generating devices 26 therein.

The outer casing is preferably fabricated using an in-situ molding process compatible with the conventional chip packaging process and preferably made of materials such as metals, plastics, and the like materials, which are capable of containing fluid. The outer casing serves as a robust chip package containing one or more chips. The enclosure 12 has an inlet 16 for receiving coolant and an outlet 18 for expelling the coolant, in which the coolant is used for removing the heat generated by the heat-generating devices 26(a–c). The inlet 16 and the outlet 18 are preferably disposed opposite to each other with the inlet 16 located on one side of the enclosure 12 and the outlet 18 located on the opposite side of the enclosure 12 as shown in FIG. 1. Although other arrangements are also possible, this arrangement provides multiple parallel paths for the coolant to flow in the cooling assembly 10 when entering by the inlet 16 and leaving through the outlet 18. This arrangement also enhances heat dissipation by alleviating the trapping of the coolant inside the enclosure 12. The enclosure 12 may also have multiple inlets and outlets, each positioned optimally on the sides of the enclosure 12 for receiving and expelling the coolant. Furthermore, there exist pressure differences between the inlet 16 and the outlet 18. The various structures inside the cooling assembly 10, as well as the viscosity of the coolant cause the pressure differences.

The coolant is preferably pumped into the inlet 16 by an external close-circuit micro-pump (not shown) and distributed into a plurality of channels 24 that are generally parallel and further redistributed into a plurality of upper sub-channels 24a and lower sub-channels 24b that are also generally parallel, and finally out of the outlet 18 to a heat exchanger (also not shown). However, the invention is not limited to a closed-circuit micro pump system. The coolant expelled from the outlet 18 can be channeled to other modules to be used for other purposes. That is, the coolant is not being pumped back into the cooling assembly 10. As the coolant passes through the various channels, it comes into contact with the various structures inside the cooling assembly 10, thereby efficiently removing heat from the various structures. The coolant is preferably made of an electrically non-conductive fluid such as fluro-carbon (FC) 72, FC87, FC84, FC77, and the like cooling fluid. The FC compound family is capable of absorbing heat without causing electrical short-circuit to the heat-generating devices 26(a–c) being cooled Furthermore, the fluid may undergo phase changes as the temperature changes. Thus, in some cases, the fluid enters the nclosure 12 in one phase and exits in another. For example, it is known that the FC72 changes from liquid into gas at about 56 degrees Celsius. Hence, it is possible that the FC72 enters the enclosure 12 in the liquid form and exits the enclosure 12 in the gas form if the temperature inside the cooling assembly 10 is 56 degrees Celsius.

The plurality of channels 24 is formed by space created by stacking the plurality of chip carriers 20(a–c) and spatially displacing or separating each chip carrier from the other by a plurality of carrier connectors 22(a–c). One of the channels 24 is formed by the space between the bottom surface of the chip carrier 20a and the top surface of the distribution carrier 30 with the one of the channels 24 extending within the concavity. Another one of the channels 24 is formed by the space between the bottom surface of the distribution carrier 30 and the substrate 14.

Each of the heat-generating devices 26(a–c) has a plurality of input-output ports, hereinafter referred to as chip contact pads 38(a–c) as shown in FIG. 2. The heat-generating devices 26(a–c) are mounted on the chip carriers 20(a–c) as shown in FIGS. 1 and 2. Depending on the size of the chip carriers 20(a–c) and the heat-generating devices 26(a–c), it is possible to mount more than one heat-generating devices on each of the chip carriers 20(a–c). Each heat-generating device 26(a–c) is spatially displaced from the surface of the respective chip carriers 20(a–c) by a plurality of chip connectors 28(a–c). Alternatively, if each of the heat-generating devices 26(a–c) has leads for use as input-output ports, the leads can be directly connected to the respective chip carriers 20(a–c). In this way, each lower sub-channel 24b is created by the space between the top surface of the respective chip carrier 20(a–c) and the bottom surface of the respective heat-generating device 26(a–c) using these leads. Each of the upper sub-channels 24a is created by the space between the top surface of the respective heat-generating device 26(a–c) and the bottom surface of the respective chip carrier 20(a–c) with the exception of the upper-most chip carrier 20c, wherein the upper boundary of the channel 24 and the upper sub-channel 24a is the ceiling of the enclosure 12 as shown in FIG. 1.

The chip carriers 20(a–c) are preferably made of silicon substrate. Each of the plurality of chip carriers 20(a–c) has carrier contact pads 36(a–c), carrier traces 33(a–c) and 34(a–c) patterned or laid on the surfaces of the chip carriers 20(a–c), and a plurality of carrier vias 31(a–c) for use as interconnectors as shown in FIGS. 2 and 3. FIG. 2 shows a cross-sectional front view of the cooling assembly 10 illustrating the electrical interconnections between the various elements of the cooling assembly 10. FIG. 3 shows a cross-sectional side view from side A of the cooling assembly 10 illustrating the electrical interconnections between the various elements of the cooling assembly 10. Further, each chip carrier 20(a–c) has a plurality of carrier intermediate connectors 32(a–c) and a plurality of carrier upper peripheral contact pads 35(a–c) disposed on a portion of a surface of the respective chip carriers 20(a–c) for receiving electrical signals from the respective carrier connectors 22(a–c) or the respective carrier traces 33(a–c). The plurality of carrier surface contact pads 36(a–c) disposed on another portion of the surface of the respective chip carrier 20(a–c) is for receiving electrical signals from the respective chip connectors 28(a–c), and a plurality of carrier lower peripheral contact pads 37(a–c) disposed on yet another portion of the surface of the respective chip carriers 20(a–c) is for receiving electrical signals from the respective carrier traces 34(a–c) or the respective carrier intermediate connectors 32(a–c). The plurality of carrier intermediate connectors 32(a–c) connect electrical signals from the respective carrier upper peripheral contact pads 35(a–c) to the respective carrier lower peripheral contact pads 37(a–c). The plurality of carrier traces 33(a–c) connect electrical signals from the respective carrier surface contact pads 36(a–c) to the respective carrier upper peripheral contact pads 35(a–c). The plurality of carrier traces 34(a–c) also connect electrical signals from the respective carrier surface contact pads 36(a–c), but to the respective carrier lower peripheral contact pads 37(a–c) through the carrier vias 31(a–c). The use of the plurality of carrier traces 33(a–c) and 34(a–c) is dependent on the requirements of the electrical routing of the heat-generative devices 26(a–c). The plurality of carrier intermediate connectors 32(a–c) and carrier traces 33(a–c) and 34(a–c) are made of electrical conductive materials and are easily fabricated using conventional processes known in the art. For example, the carrier traces 33(a–c) and 34(a–c) can be fabricated using known additive or subtractive metallization process such as sputtering or plating deposition methods.

When the chip carriers 20(a–c) are made of silicon substrate or the like substrates, semiconductor devices other then the heat-generating devices 26(a–c) can also be fabricated on the chip carriers 20(a–c) using the conventional integrated circuit fabrication processes such as etching and lithographic processes. Therefore, the chip carriers 20(a–c) no longer only serve as passive carriers, but are also capable of being used as substrates for fabricating other heat-generating active semiconductor devices thereon.

The distribution carrier 30 is preferably made of silicon substrate. The purpose of the distribution carrier 30 is to distribute the plurality of electrical signals it receives from or transmits to the plurality of heat-generating devices 26(a–c) via the various connectors and carrier traces for connecting to a plurality of substrate contact pads 17 on the substrate 14 as described in more detail hereinafter. The distribution carrier 30 is spatially displaced from the substrate 14 by a plurality of distribution carrier connectors 40, thus creating one of the plurality of channels 24. For heat-generating devices with a low number of input-output ports, the distribution carrier 30 may not be required. The chip carrier 20a is also capable of being used as a way of distributing low-density electrical signals. The distribution carrier 30 has a plurality of distribution carrier bottom contact pads 45 disposed on the bottom surface and a plurality of distribution carrier top contact pads 46 disposed on the top surface of the distribution carrier 30. Connecting the distribution carrier bottom and top contact pads 45 and 46 are a plurality of distribution carrier intermediate connectors 42 and a plurality of distribution carrier traces 44a and 44b as shown in FIGS. 2 and 3. The plurality of distribution carrier bottom contact pads 45 transmit or receive the electrical signals received from or transmitted to the respective distribution carrier traces 44a and distribution carrier trances 44b and distribution carrier intermediate connectors 42 to the respective substrate contact pads 17 via the respective distribution carrier connectors 40.

For example, with reference to FIGS. 2 and 3, in the electrical connection of a heat-generating device 26b having four input-output ports or chip contact pads 38b, the four chip contact pads 38b of the heat-generating device 26b are connected to the chip carrier 20b through the plurality of chip connectors 28b. Each of the chip connectors 28b connects the respective chip contact pads 38b to the respective carrier surface contact pads 36b for transmitting or receiving electrical signals therebetween. The chip connectors 28b also function as a spacer to create space between the bottom surface of the heat-generating device 26b and the top surface of the chip carrier 20b, thereby forming the lower sub-channel 24b for the coolant to pass through. Heat produced by the heat-generating device 26b is dissipated from the surfaces of the heat-generating device 26b and heat is also transferred to the neighboring chip carriers 20b and 20c by radiation as well as by conduction via the plurality of chip connectors 28b to the chip carrier 20b. As the coolant passes through the lower sub-channel 24b, it comes into contact with the bottom surface of the heat-generating device 26b, the chip connectors 28b, and the top surface of the chip carrier 20b and removes the heat therefrom.

The electrical signals at the respective carrier surface contact pads 36b are transmitted to or received from the respective carrier top peripheral contact pads 35b through the respective carrier traces 33b that traverse the top surface of the carrier 20b. Alternatively, the electrical signals at the respective carrier surface contact pads 36b can be transmitted to or received from the respective lower peripheral contact pads 37b through the respective carrier vias 31b and the respective carrier traces 34b that traverse the bottom surface of the carrier 20b. These electrical signals are further transmitted to or received from the chip carrier 20a through the respective carrier connectors 22b which electrically connect the respective carrier lower peripheral contact pads 37b and the respective carrier upper peripheral contact pads 35a. At the chip carrier 20a, the electrical signals at the respective carrier upper peripheral contact pads 35a are transmitted to or received from the respective carrier lower peripheral contact pads 37a through the respective chip carrier intermediate connectors 32a. The electrical signals at the carrier lower peripheral contact pads 37a are further transmitted to or received from the respective distribution carrier top contact pads 46 of the distribution carrier 30. The electrical signals at the respective distribution carrier top contact pads 46 are further transmitted to or received from the respective distribution carrier bottom contact pads 45 through the respective distribution carrier traces 44a and 44b and distribution carrier intermediate connectors 42, and are finally transmitted to or received from the respective substrate contact pads 17 through the respective distribution carrier connectors 40. The electrical signals at the plurality of substrate contact pads 17 are then transmitted to the respective substrate connectors 15 through a plurality of substrate intermediate connectors (not shown). The carrier traces, carrier vias and carrier connectors described above are shown as solid lines as seen in FIGS. 2 and 3.

At the same time, other electrical signals from the heat-generating device 26a are also being transmitted to or received from different respective carrier top peripheral contact pads 35a through different respective carrier traces 33a that traverse the top surface of the carrier 20a, or through different respective carrier vias 3 1a and different respective carrier traces 34a that traverse the bottom surface of the carrier 20a to different respective carrier lower peripheral contact pads 37a. Similarly, other electrical signals from a heat-generating device 26c are being transmitted to or received from the respective carrier top peripheral contact pads 35c or carrier lower peripheral contact pads 37c through the respective carrier traces, carrier vias and carrier connectors in the stack arrangement as described above. The carrier traces, carrier vias and carrier connectors relating to the heat-generating devices 26a and 26c and the carriers 20a and 20c are shown as dotted lines as seen in FIGS. 2 and 3.

In the foregoing example of the stacking arrangement with each of the heat-generating devices 26(a–c) having four chip contact pads 38(a–c), the first chip carrier 20a requires more chip carrier intermediate connectors 32a and chip carrier connectors 22a as compared to the second chip carrier 20b. Similarly, the second chip carrier 20b requires more chip carrier intermediate connectors 32b and chip carrier connectors 22b as compared to the third chip carrier 20c as seen in FIG. 3. The factor of increase in the number of chip carrier intermediate connectors and chip carrier connectors from one stacking level to the next depends on the electrical connection requirements of the heat-generating devices and complexity thereof. But generally, the chip carrier closest to the substrate 14, namely, the chip carrier 20a, requires the most connectors to cater for the plurality of electrical signals transmitted to or received from the other chip carriers.

A further advantage of such a stacking arrangement lies in its heat distribution characteristic. Heat generated by a heat-generating device is transferred to the neighboring chip carriers via the various connectors and traces. This heat distribution characteristic is advantageous in situations where a heat-generating device generates more heat than the other heat-generating devices inside the cooling assembly 10. In this case, the heat is not overly concentrated at the heat-generating device that generates more heat, but is dispersed to the neighboring chip carriers via the various connectors and traces.

In the first embodiment, the carrier interconnectors 22(a–c), the chip connectors 28(a–c), and the redistribution carrier interconnectors 40 are preferably solder balls. It will be apparent to one skilled in the art to use any of a number of alternative connectors known in the art It will also be apparent that the numbers of contact pads, connectors, intermediate connectors, and traces required are dependent on the electrical connection requirements of the heat-generating devices. As such, the electrical connections described in the foregoing with reference to FIGS. 1, 2 and 3 are merely for illustrative purposes and variations thereof are possible in accordance with the requirements of the applications.

Figure 4A:
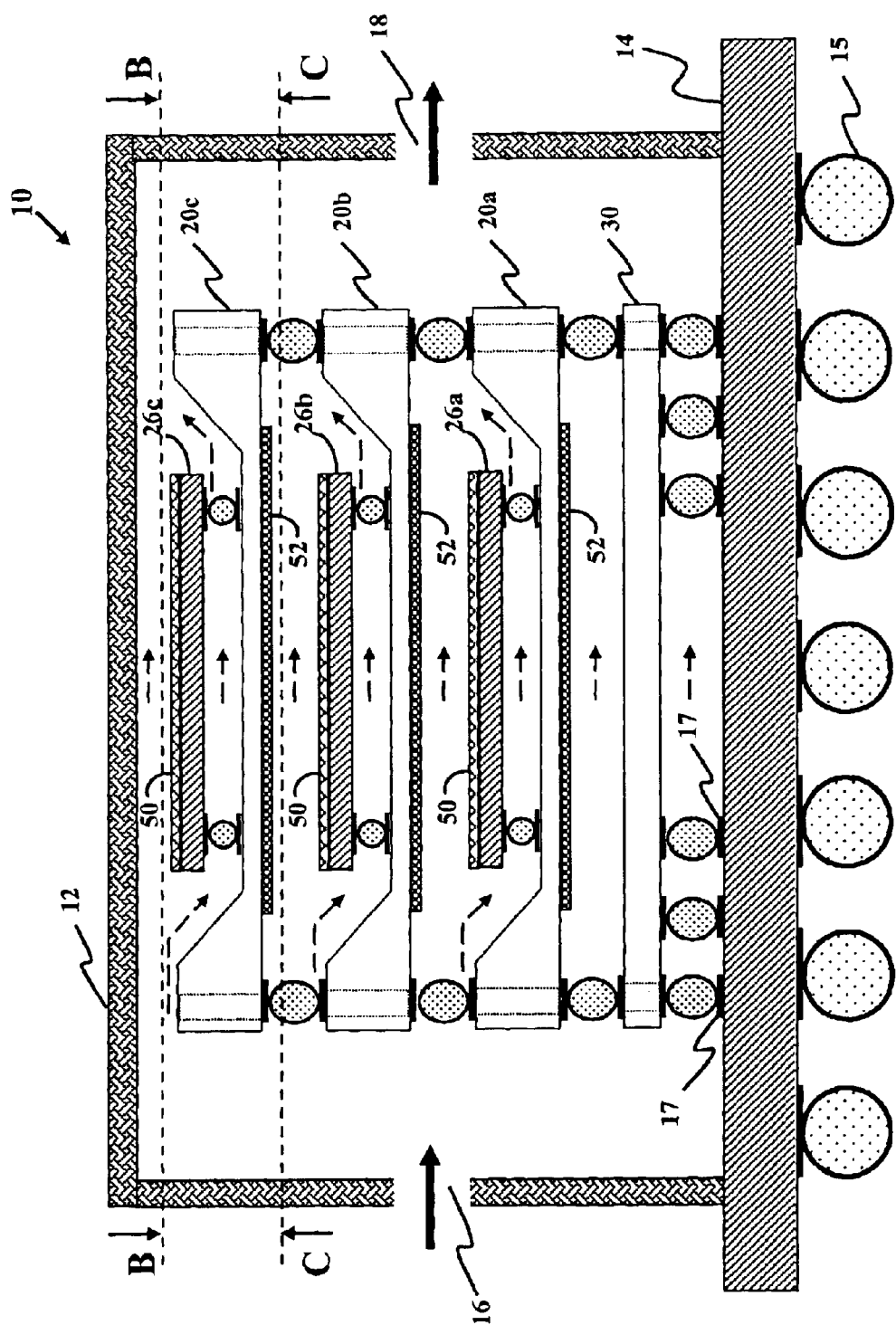
FIG. 4A shows a cross-sectional front view of a cooling assembly in accordance with a second embodiment of the invention.
Figure 4B:
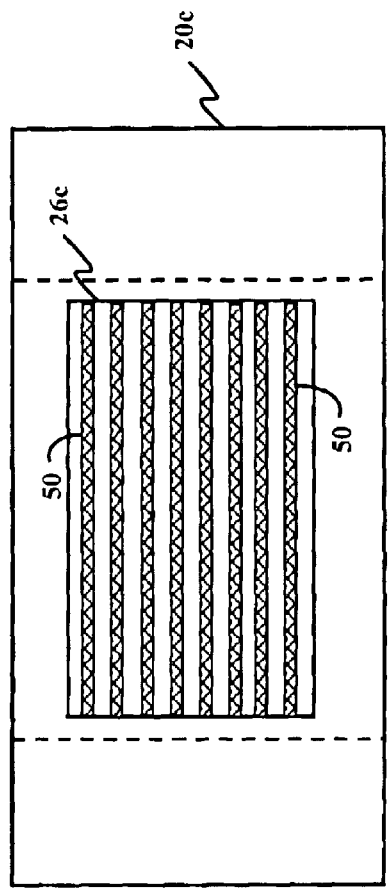
FIG. 4B shows a cross-sectional top view from the plane B—B of the cooling assembly of FIG. 4A.
Figure 4C:
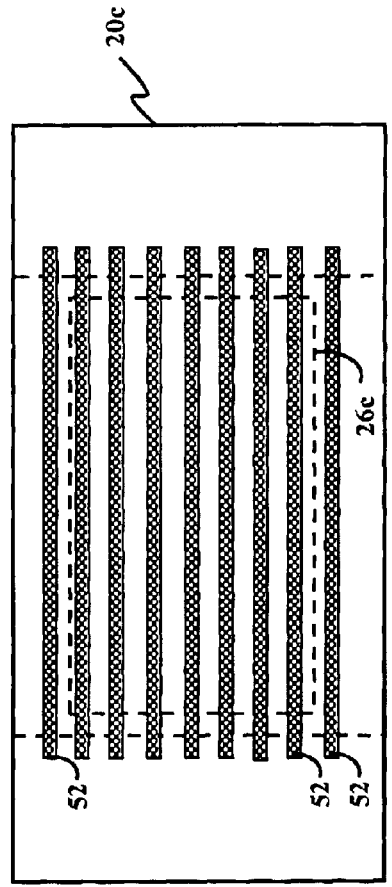
FIG. 4C shows a cross-sectional bottom view from the plane C—C of the cooling assembly of FIG. 4A.

A second embodiment according to the invention is shown in FIGS. 4A, 4B and 4C, wherein the effectiveness of removing the heat generated by the plurality of heat-generating devices 26(a–c) in the cooling assembly 10 is substantially enhanced with the addition of a plurality of heat dissipation enhancement microstructures 50 and 52. The descriptions in relation to the structural configurations of and positional relationships among the elements described in the first embodiment of the invention with reference to FIGS. 1, 2, and 3 are incorporated herein.

The heat generated by the plurality of heat-generating devices 26(a–c) in the cooling assembly 10 dissipates from the surfaces of the plurality of heat-generating devices 26(a–c). The heat also transfers from the surfaces of the plurality of heat-generating devices 26(a–c) to the plurality of chip carriers 20(a–c) by radiation as well as by conduction via, mainly, the plurality of chip connectors 28(a–c). As described in the foregoing in relation to the first embodiment, the coolant coming into contact with the various heat carrying structures inside the cooling assembly 10 removes the heat. The effectiveness of heat removal therefrom is substantially enhanced by incorporate the plurality of heat dissipation enhancement microstructures 50 and 52 to the plurality of heat-generating devices 26(a–c) and the plurality of chip carrier 20(a–c) respectively as shown in FIGS. 4A, 4B and 4C. The plurality of heat dissipation enhancement microstructures 50 and 52 can be fabricated separately and then bonded or otherwise attached to the surface of the plurality of heat-generating devices 26(a–c) and the plurality of chip carriers 20(a–c) respectively. These heat dissipation enhancement microstructures 50 and 52 are preferably made of the conventional heat conducting materials and these function in the same manner as the conventional heat sink. However, to avoid this bonding or otherwise attaching step, which not only translate into higher manufacturing cost but the bonding materials or attaching mechanism can impede heat transfer therebetween, the plurality of heat dissipation enhancement microstructures 50 and 52 are preferably fabricated from materials used for fabricating the plurality of heat-generating devices 26(a–c) and the plurality of chip carriers 20(a–c) to form an array of elongated protuberant members unitary with the plurality of heat-generating devices 26(a–c) and the plurality of chip carriers 20(a–c). The dimensions of heat dissipation enhancement microstructures 50 and 52 can vary, but typically, these can be approximately 50 micrometers in width and 400 micrometers in height. Further, the plurality of heat dissipation enhancement microstructures 50 and 52 are preferably disposed adjacent to each other to form a plurality of micro-channels having width ranging from 40 micrometers to 200 micrometers.

It will be apparent to one skilled in the art that the above positioning and combination of positioning the plurality of heat transfer enhancement microstructures 50 and 52 on the plurality of heat-generating devices 26(a–c) and the plurality of chip carriers 20(a–c), respectively, can be varied. For example, it is conceivable to position additional heat transfer enhancement microstructures at the bottom surfaces of the plurality of heat-generating devices 26(a–c) in the sub-channels 24a, if the bottom surfaces are not occupied by the input-output ports of the plurality of heat-generating devices.

In accordance with the foregoing structures, it is apparent that every surface of the plurality of the heat-generating devices 26(a–c) comes into contact with the coolant either directly or indirectly via the various connectors, which are exposed to the coolant. Further, as the cooling assembly 10 is filled with the coolant, every structure exposed to heat is in contact with the coolant, thereby maximizing heat dissipation therefrom.

Figure 5:
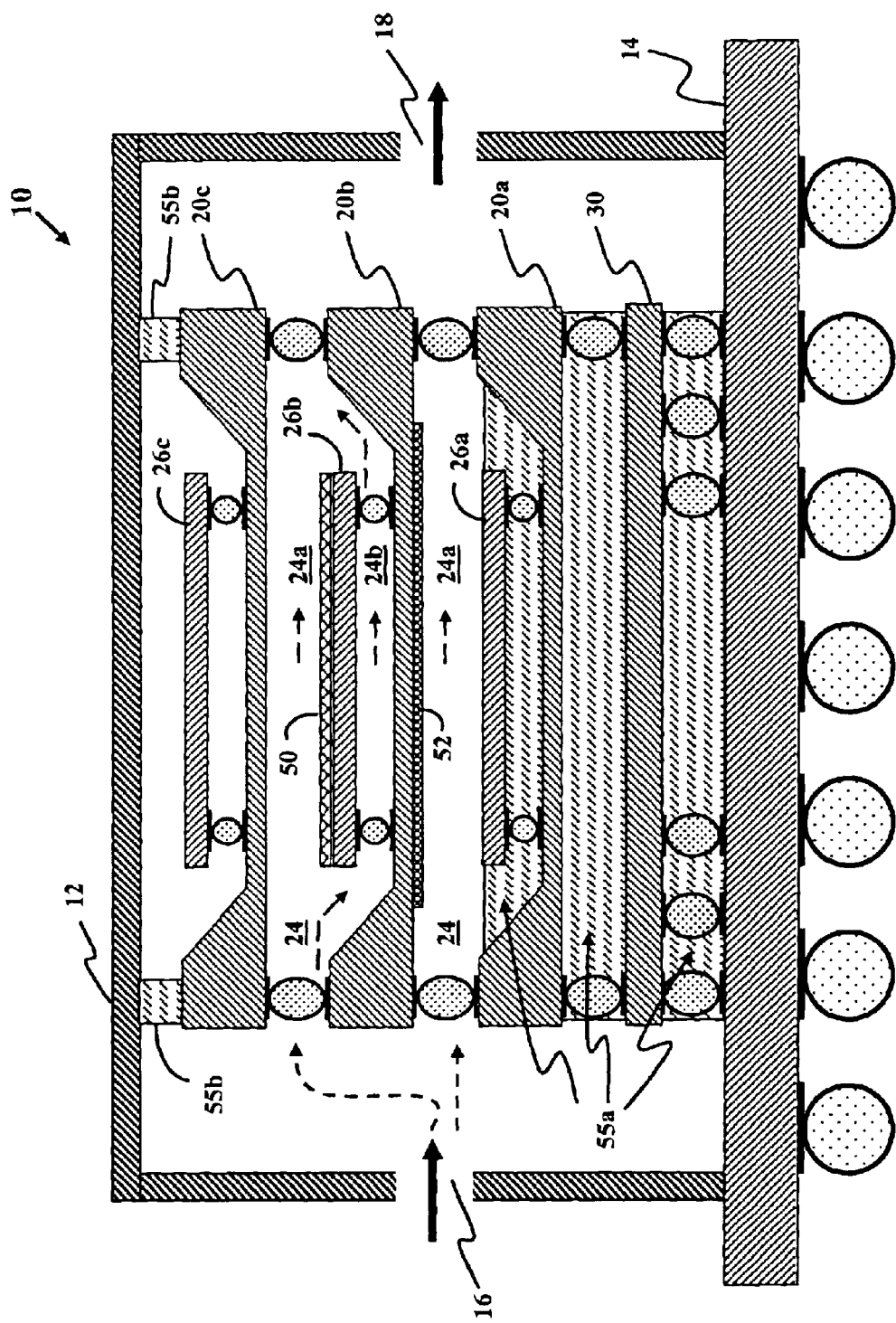
FIG. 5 shows a cross-sectional front view of a cooling assembly in accordance with a third embodiment of the invention.

A third embodiment according to the invention is shown in FIG. 5, wherein the coolant may be directed to the regions where heat is concentrated by using under-fills 55a and 55b to seal off certain channels in the cooling assembly 10. The descriptions in relation to the structural configurations of and positional relationships among the elements described in the first and second embodiments of the invention with reference to FIGS. 1, 2, 3, 4A, 4B and 4C are incorporated herein.

In the stacking arrangement as described in the foregoing, certain heat-generating devices 26(a–c) dissipate more heat than the others. Therefore, it may be desirous to direct the coolant to where the heat is concentrated in order to effectively and economically maintain the temperature of the particular heat-generating devices 26(a–c) at a safe level. For example, if the heat is mostly concentrated at the heat-generating device 26b region as compared to the distribution carrier region and the heat-generating device 26c region, the coolant may be directed to the heat-generating device 26b region by either substantially filling the channels with the under-fill 55a or by blocking the channel opening using the under-fill 55b as seen in FIG. 5. In this way, a substantially lesser amount of coolant is needed to keep the temperature in the cooling assembly 10 at a low level. The under-fills 55a and 55b are preferably made of electrically non-conductive materials and these may be applied using a conventional packaging process.

Figure 6:
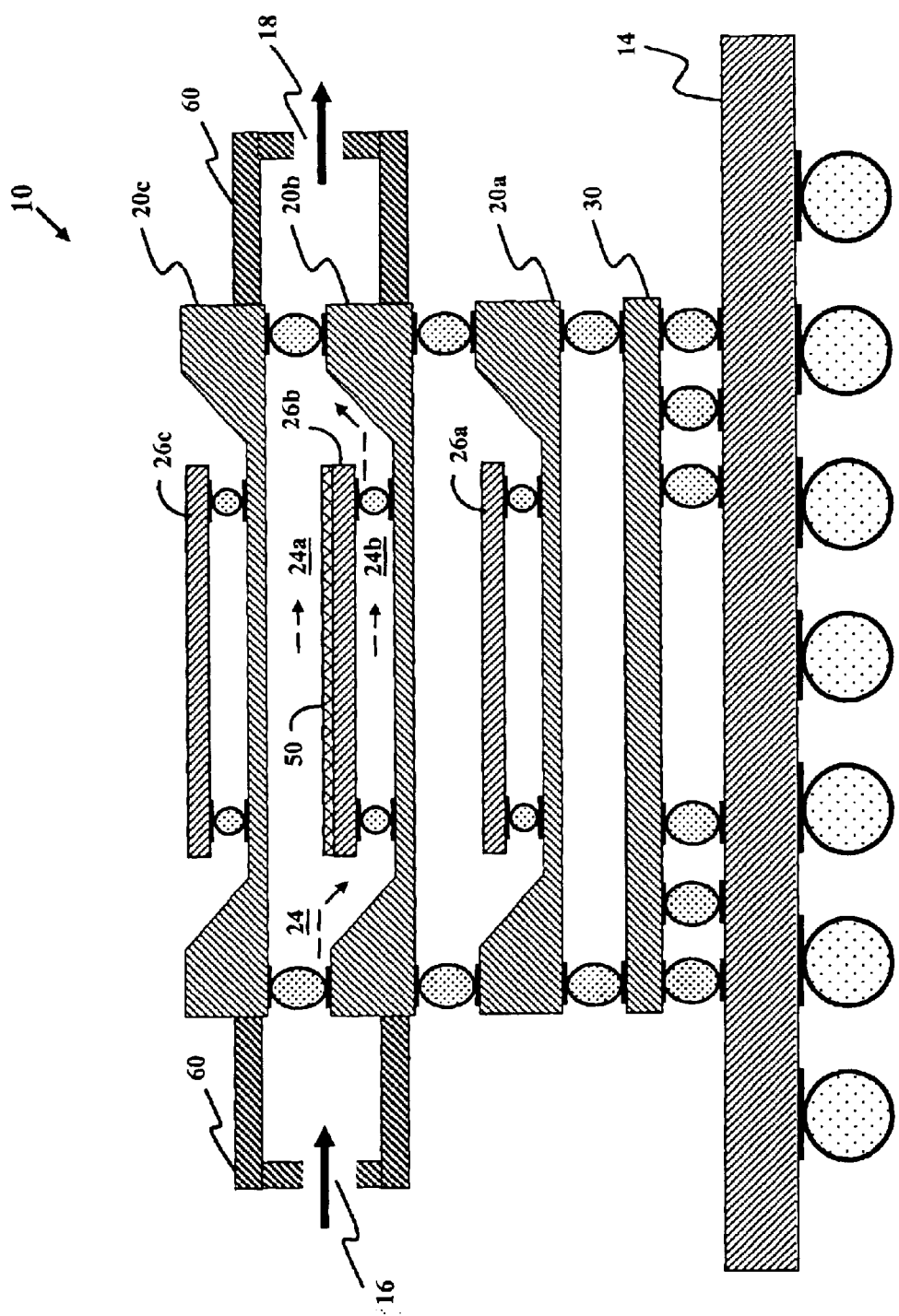
FIG. 6 shows a cross-sectional front view of a cooling assembly in accordance with a fourth embodiment of the invention.

A fourth embodiment according to the invention is shown in FIG. 6, wherein the coolant is only applied to the regions where heat is concentrated by providing an enclosure 60 to enclose only the regions where cooling is needed. The descriptions in relation to the structural configurations of and positional relationships among the elements described in the first, second and third embodiments of the invention with reference to FIGS. 1, 2, 3, 4A, 4B, 4C and 5 are incorporated herein.

In the stacking arrangement as described in the foregoing, certain heat-generating devices 26(a–c) dissipate more heat than the others. Therefore, it may be desirous to apply the coolant to where the heat is most concentrated in order to effectively and economically maintain the temperature of the particular heat-generating devices 26(a–c) at a safe level. For example, if the heat is mostly concentrated at the heat-generating device 26b region, the enclosure 60 may be provided to enclose only the heat-generating device 26b and the chip carrier 20b as seen in FIG. 6. In this way, a substantially lesser amount of coolant is needed to keep the temperature of the heat-generating device 26b at a safe level.

In the foregoing, although only a number of embodiments of the invention are disclosed, it will be apparent to one skilled in the art in view of this disclosure that numerous changes, modifications and combinations can be made without departing from the scope and spirit of the invention. For example, the plurality of heat-generating devices 26(a–c) may be spatially displaced from the surface of the respective chip carriers 20(a–c) by one or more supporting structures and the plurality of chip connectors 28(a–c) may be replaced by alternative electrical connectors. Similarly, the plurality of chip carriers 20(a–c) may be spatially displaced from each other and from the distribution carrier 30 by one or more supporting structures and the plurality of carrier connectors 22(a–c) may be replaced by alternative electrical connectors. Furthermore, not all the electrical signals need to be transmitted to the substrate 14. It is possible that some of these electrical signals are for communication with other heat-generating devices 26(a–c) within the stacking arrangement as described in the foregoing.

What is claimed is:

1. A method for fluid-based cooling of heat-generating devices, comprising the steps of:

mounting a heat-generating device onto a first portion of the surface of a first carrier;

spatially displacing the heat-generating device from the first portion of the surface of the first carrier for forming a first channel therebetween;

stacking a second carrier and the first carrier;

spatially displacing the second carrier from the first carrier for forming a second channel between a portion of the surface of the first heat-generating device and a portion of the surface of the second carrier;

enclosing at least a portion of the second carrier, the heat-generating device and at least a portion of the first carrier; and introducing cooling fluid into the enclosure and into at least one of the first and second channels, the cooling fluid being substantially electrically non-conductive and for extracting heat from and thereby cooling at least one of the heat-generating device and at least one of the first portions of the surface of the first carrier and the portion of the surface of the second carrier, wherein heat generating devices are mountable only on each of the portion of the surface of the first carrier and a portion of the surface of the second carrier, the portion of the surface of the first carrier being substantially parallel to and facing the same direction as the portion of the surface of the second carrier.

2. The method as in claim 1, further comprising the step of expelling the cooling fluid from the enclosure.

3. The method as in claim 2, wherein the step of enclosing the heat-generating device and the at least the portions of the first and second carriers comprises the step of forming an enclosure having an inlet for introducing the cooling fluid thereinto and an outlet for expelling the cooling fluid therefrom.

4. The method as in claim 1, wherein the step of mounting the heat-generating device onto the first portion of the first carrier comprises the step of using a connector for interconnecting an electrical contact pad on the heat-generating device and an electrical contact pad on the first portion of the surface of the first carrier, wherein the first connector is electrically conductive.

5. The method as in claim 4, wherein the step of spatially displacing the heat-generating device from the surface of the first carrier comprises the step of using the connector to spatially displace the heat-generating device from the first portion of the surface of the first carrier.

6. The method as in claim 1, wherein the step of stacking the second carrier and the first carrier comprises the step of using a connector for interconnecting an electrical contact pad on a portion of the surface of the second carrier and an electrical contact pad on a second portion of the surface of the first carrier.

7. The method as in claim 6, wherein the step of spatially displacing the second carrier from the first carrier comprises the step of using the connector to spatially displace the second carrier from the first carrier.

8. The method as in claim 1, further comprising the step of:

spatially displacing a third carrier from the second carrier;

mounting a heat generating device onto the second carrier, the heat generating device being spatially displaced from the second carrier for forming a third channel therewith and for further forming a fourth channel with the third carrier, the cooling fluid further passaging through the at least one of the third channel and the fourth channel; and substantially impeding the flow of the cooling fluid through at least one of the first and second channels.

9. The method as in claim 8, wherein the step of substantially impeding the flow of the cooling fluid comprises the step of substantially filling at least one of the first and second channels with an electrical non-conductive material.

10. The method as in claim 1, further comprising the step of coupling a heat dissipation enhancer to a portion of the surface of at least one of the heat-generating device, first and second carriers.

11. The method as in claim 10, wherein the step of coupling a heat dissipation enhancer comprises the step of unitarily fabricating the heat dissipation enhancer from materials used for fabricating the heat-generating device, first and second carriers.

12. A cooling assembly for fluid-based cooling of heat-generating devices, comprising:

a first carrier;

a heat-generating device mounted on a first portion of the surface of the first carrier;

a first channel formed by spatially displacing the heat-generating device from the first portion of the surface of the first carrier;

a second carrier, wherein the first and second carriers are stacked;

a second channel formed by spatially displacing the second carrier from the first carrier, the second channel being the space between a portion of the surface of the heat-generating device and a portion of the surface of the second carrier; and an enclosure for enclosing at least a portion of the second carrier, the heat-generating device and at least a portion of the first carrier, whereby cooling fluid is introduced into the enclosure and into at least one of the first and second channels, the cooling fluid being substantially electrically non-conductive and being for extracting heat from and thereby cooling at least one of the heat-generating device and the at least the portions of the first and second carriers, wherein heat generating devices are mountable only on each of the portion of the surface of the first carrier and a portion of the surface of the second carrier, the portion of the surface of the first carrier being substantially parallel to and facing the same direction as the portion of the surface of the second carrier.

13. The cooling assembly as in claim 12, wherein the enclosure comprises an inlet for introducing the cooling fluid thereinto and an outlet for expelling the heated cooling fluid therefrom.

14. The cooling assembly as in claim 12, further comprising a connector, wherein the first connector interconnects an electrical contact pad on the heat-generating device and an electrical contact pad on the first portion of the surface of the first carrier.

15. The cooling assembly as in claim 12, further comprising a connector, wherein the second connector interconnects an electrical contact pad on a portion of the surface of the second carrier and an electrical contact pad on a second portion of the surface of the first carrier.

16. The cooling assembly as in claim 12, further comprising a third carrier spatially displaced from the second carrier;

a heat generating device mounted onto and spatially displaced from the second carrier for forming a third channel therewith and for further forming a fourth channel with the third carrier, the cooling fluid further passaging through the at least one of the third channel and the fourth channel; and a filler for substantially filling at least one of the first and second channels for impeding the flow of the cooling fluid thereinto, wherein the filler being made of electrical non-conductive material.

17. The cooling assembly as in claim 12, further comprising a heat dissipation enhancer coupled to a portion of the surface of at least one of the heat-generating device, first and second carriers.

18. The cooling assembly as in claim 12, the heat generating device being substantially received within a concavity, the concavity being formed in the first carrier and defining the first portion of the surface of the first carrier, at least a portion of the first channel extending within the concavity and the concavity being shaped and dimensioned for the passage of the cooling fluid therethrough.

19. A method for fluid-based cooling of heat-generating devices, comprising the steps of:

mounting a heat-generating device onto a first portion of the surface of a first carrier;

spatially displacing the heat-generating device from the first portion of the surface of the first carrier for forming a first channel therebetween, the heat generating device being substantially received within a concavity, the concavity being formed in the first carrier and defining the first portion of the surface of the first carrier, at least a portion of the first channel extending within the concavity;

stacking a second carrier and the first carrier;

spatially displacing the second carrier from the first carrier for forming a second channel between a portion of the surface of the first heat-generating device and a portion of the surface of the second carrier;

enclosing at least a portion of the second carrier, the heat-generating device and at least a portion of the first carrier; and introducing cooling fluid into the enclosure and into at least one of the first and second channels, the cooling fluid being substantially electrically non-conductive and for extracting heat from and thereby cooling at least one of the heat-generating device and at least one of the first portion of the surface of the first carrier and the portion of the surface of the second carrier, the concavity being shaped and dimensioned for the passage of the cooling fluid therethrough, wherein heat generating devices are mountable only on each of the portion of the surface of the first and a portion of the surface of the second carrier, the portion of the surface of the first carrier being substantially parallel to and facing the same direction as the portion of the surface of the second carrier.

* * * * *